(12) United States Patent
Lin

(10) Patent No.: US 6,853,011 B2
(45) Date of Patent: Feb. 8, 2005

(54) LIGHT EMITTING DIODE AND METHOD OF MAKING THE SAME

(75) Inventor: Jin-Ywan Lin, Chung Li (TW)

(73) Assignee: United Epitaxy Co., Ltd., Hsinchu (TW)

( * ) Notice: Subject to any disclaimer, the term of this patent is extended or adjusted under 35 U.S.C. 154(b) by 0 days.

(21) Appl. No.: 10/354,036

(22) Filed: Jan. 30, 2003

(65) Prior Publication Data
US 2004/0090179 A1 May 13, 2004

(30) Foreign Application Priority Data
Nov. 8, 2002 (TW) .......................................... 91132947 A

(51) Int. Cl.⁷ .......................... H01L 33/00; H01L 21/00
(52) U.S. Cl. .............................. 257/99; 257/81; 257/91; 257/94; 257/95; 257/103; 438/22; 438/29; 438/37; 438/46; 438/47
(58) Field of Search ....................... 257/1–103; 438/22, 438/29, 37, 46, 47

(56) References Cited
U.S. PATENT DOCUMENTS
6,201,265 B1 * 3/2001 Teraguchi ..................... 257/99
2001/0045564 A1 * 11/2001 Koike et al. .................. 257/88

* cited by examiner

Primary Examiner—Donghee Kang
(74) Attorney, Agent, or Firm—Troxell Law Office PLLC

(57) ABSTRACT

A light emitting epi-layer structure contains a temporary substrate of absorption light type on one side. The other side thereof is then adhered to a transparent substrate of light absorption free by BCB bonding layer. After that, the light absorption substrate portion is removed. The resulted light emitting structure is then patterned to form a connection channel to connect the first ohmic contact electrode and form an isolation trench to separate the active layer of the light emitting structure into two parts. Thereafter, a second ohmic contact electrode on the cladding layer and a bonding metal layer filled in the first channel and on second ohmic contact electrode are successively formed. The resulted LED structure is hence convenient for flip-chip package since two bonding metal layers have the same altitude.

7 Claims, 5 Drawing Sheets

LIGHT EMITTING DIODE AND METHOD OF MAKING THE SAME

BACKGROUND OF THE INVENTION

1. Field of the Invention

The present invention relates to a light emitting device, and more particularly to an AlGaInP light emitting diode structure and the making method.

2. Description of the Prior Art

The conventional AlGaInP LED has a double heterostructure (DH), as shown in FIG. 6. The LED stacked sequentially, from a bottom thereof, has an n-type ohmic contact electrode 2, a GaAs substrate 3, an n-type $(Al_xGa_{1-x})_{0.5}In_{0.5}P$ lower cladding layer 4 with an Al composition between about 70%–100%, an $(Al_xGa_{1-x})_{0.5}In_{0.5}P$ active layer 5 with an Al composition of 0%–45%, a p-type $(Al_xGa_{1-x})_{0.5}In_{0.5}P$ upper cladding layer 6 with an Al composition 70%–100%, a p-type high energy band gap current spreading layer 7 such as layers of GaP, GaAsP, AlGaAs or GaInP, and a p-type ohmic contact layer 8 as well as a bonding pad 9.

With the composition alternation of the active layer 5, the wavelengths of the light emitted are varied from 650 nm: red to 555 nm: green. A drawback is generally found in the conventional LED, that is: while the light emitted from the active layer 5 towards the substrate 3 will be totally absorbed by GaAs substrate 3. It is because the GaAs substrate has an energy gap smaller than that of the active layer 5. Therefore, the light generated is absorbed resulted in lower light generated efficiency for this kind of conventional AlGaInP LED.

To overcome the substrate 3 light absorption problem, several conventional LED fabrication technologies have been disclosed. However, those conventional technologies still accompany with several disadvantages and limitations. For example, Sugawara et al. disclosed a method published in Appl. Phys. Lett. Vol. 61, 1775–1777 (1992), Sugawara et al. inserted a distributed Bragg reflector (DBR) layer in between GaAs substrate and lower cladding layer so as to reflect those light emitted toward the GaAs substrate. However, the reflectivity of DBR layer is usefully only for those light which almost vertically towards the GaAs substrate. With the decrease of injection angle, the reflectivity is drastically decreased. Consequently, the improvement of external quantum efficiency is limited.

Kish et al. disclosed a wafer-bonded transparent-substrate (TS) $(Al_xGa_{1-x})_{0.5}In_{0.5}P/GaP$ light emitting diode, entitled "Very high efficiency semiconductor wafer-bonded transparent-substrate $(Al_xGa_{1-x})_{0.5}In_{0.5}P/GaP$" on Appl. Phys. Lett. Vol. 64, No. 21, 2839 (1994). The TS AlGaInP LED was fabricated by growing a very thick (about 50 $\mu$m) p-type GaP window layer by hydride vapor phase epitaxy (HVPE) formed on epi-layers light emitting structure. Subsequently, the temporary n-type GaAs substrate is selectively removed using conventional chemical etching techniques. After removing the GaAs substrate, the LED epilayer structure is then bonded to an 8–10 mil thick n-type GaP substrate.

For the light illuminated concerned, the TS AlGaInP LED exhibits a two fold improvement in light output compared to absorbing substrate (AS) AlGaInP LEDs. However, the fabrication process of TS AlGaInP LED is very complicated. Since the bonding process is to make two III–V semiconductor wafers directed bond together by heating and pressing for a period of time. Even worse, a non-ohmic contact interface between them is generally found to have high resistance. To manufacture these TS AlGaInP LEDs in high yield and low cost is difficult as a result.

Another conventional technique was proposed by Horng et al., on Appl. Phys. Lett. Vol. 75, No. 20, 3054 (1999) entitled "AlGaInP light-emitting diodes with mirror substrates fabricated by wafer bonding." Horng et al., reported a mirror-substrate (MS) of $AlGaInP/metal/SiO_2/Si$ LED fabricated by wafer-fused technology. In LED, AuBe /Au stack layer function as a bonding layer for silicon substrate and epi-layer LED. However, the intensity of the AlGaInP LED is only about 90 mcd under 20 mA injecting current. The light intensity is at least lower than that of TS AlGaInP LED by 40%. It could not be satisfied.

SUMMARY OF THE INVENTION

An object of the present invention is thus to provide a LED structure which is composed a newly bonding layer and a transparent substrate.

A light emitting epi-layer structure contains a temporary substrate of absorption light type on one side. The other side thereof is then adhered to a transparent substrate of light absorption free by BCB bonding layer. After that, the light absorption substrate portion is removed. The resulted light emitting structure is then patterned to form a connection channel to connect the first ohmic contact electrode and form an isolation trench to separate the active layer of the light emitting structure into two parts. Thereafter, a second ohmic contact electrode on the cladding layer and a bonding metal layer filled in the first channel and on second ohmic contact electrode are successively formed. The resulted LED structure is hence convenient for flip-chip package since two bonding metal layers have the same altitude.

An another advantage of the present invention is without etched rough surface formed atop surface of the LED structure, which is a common existed problem for conventional processes of two electrodes at the same side but different altitudes. The LED structure according to the present invention is thus easier package than conventional one.

Furthermore, two electrodes are at the same side and at the bottom position relative to the active layer so light hindered issue by the bonding electrodes is not exist.

Still another advantage of the present invention is the simplified process. A cost glass can be used as the material of the transparent substrate. Accordingly, a throughput with high yield and low cost are achieved.

In addition, the connection channel is formed after first ohmic contact formed. Therefore, the characteristic of electro-optical is stable. At the same current density, the forward voltage is decrease without degrade the current distribution capability.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention disclosed a new LED structure and the making method. The detailed descriptions accompany with the FIG. 1 to FIG. 6 are as follows.

Figure 1:
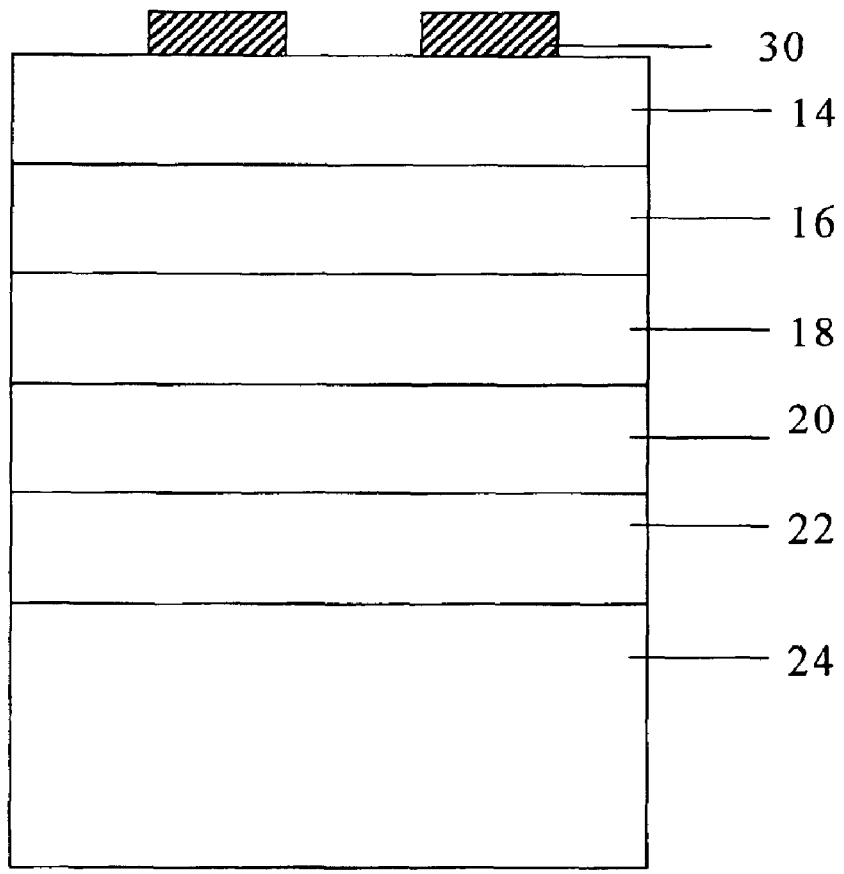
FIG. 1 is a schematic cross-sectional view of the light emitting diode before bonding with a transparent substrate according to the present invention.

Referring to FIG. 1, the cross-sectional view shows an epi-LED stack structure comprises, from a bottom thereof, an n-type temporary GaAs substrate 24 an etching stop layer 22, a lower cladding layer 20, an active layer 18, an upper cladding layer 16, a p-type ohmic contact epi-layer 14 and a p-type metal electrode 30.

The lower cladding layer 20 is an n-type $(Al_xGa_{1-x})_{0.5}In_{0.5}P$. The active layer 18 is an undoped $(Al_xGa_{1-x})_{0.5}In_{0.5}P$ layer and the upper cladding layer 16 is a p-type $(Al_xGa_{1-x})_{0.5}In_{0.5}P$ layer.

The p-type ohmic contact epi-layer 14 can be a layer selected from GaP, GaAsP, AlGaAs or GaInP, All of the candidates for serving as the p-type ohmic contact epi-layer 14 require having an energy band gap higher than those of the active layer 18 thereby alleviating the light absorption. Moreover, the p-type ohmic contact epi-layer 14 usually must have high carrier concentrations doped therein so as to form a good ohmic contact. The $(Al_xGa_{1-x})_{0.5}In_{0.5}P$ active layer 18 is with Al composition of about x=0 to 0.45. The Al dosage in the upper cladding layer 16 and lower cladding layer 20 is of about x=0.5 to 1.0. For situation of without Al containing, the wavelength of the light emitted from $Ga_{0.5}In_{0.5}P$ LED is about 635 nm, which is in range of red visible light.

As is known by skilled in the art, the ratio of forgoing compound is, for example of the preferred embodiment only, not intended to limit the claim scope. The invention is also applied to any ratio of the composition. Furthermore, the structure of active layer 18 can be a single hetero-structure (SH), a double hetero-structure (DH), or multiple quantum wells (MQW).

The preferred material of the etching stop layer 22 according to the present invention can be any III–V compound semiconductor material if it can match with that of the GaAs substrate 24 so as to reduce the dislocation density. Another constraint condition for a material to be as a candidate of the etching stop layer 22 is the etching selectively thereof. The etching stop layer 22 should be with a lower etching rate than the GaAs substrate 24.

The good candidates of those satisfied above conditions, for examples, InGaP or AlGaAs can be served. The lower cladding layer 20 can also be served as the etching stop layer 22 since it has a high selectivity to GaAs substrate 24, and thus if the thickness of the lower cladding layer 20 is thick enough, the etch stop layer 22 is optional.

Figure 2:
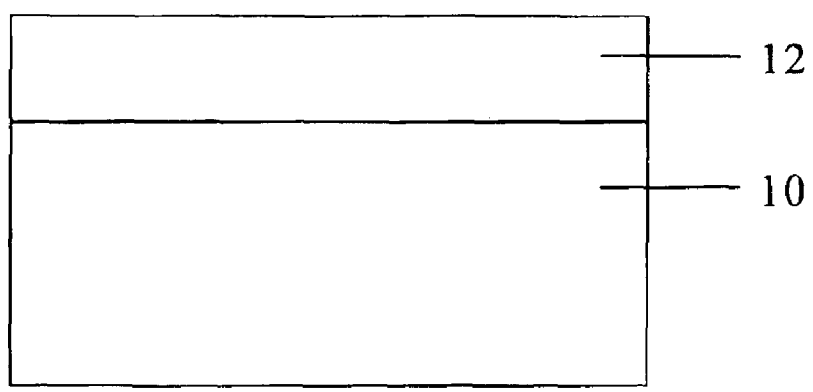
FIG. 2 is a schematic cross-sectional view of the transparent substrate coated with transparent adhesive layer according to the present invention.

Subsequently, a substrate structure as shown in FIG. 2 is prepared. The structure comprises a transparent adhesive layer 12, for example, a BCB (B-staged bisbenzocyclobutene; BCB) layer and a transparent substrate (TS) 10.

The transparent substrate 10 can be a substrate selected from glass, sapphire, SiC, GaP, GaAsP, ZnSe, ZnS, or ZnSSe. Other materials can also be chosen as the transparent substrate 10 as long as the light absorption by the material is minor. One advantage of the present invention is that the transparent substrate 10 is not limited to be a single crystal substrate. The transparent substrate herein is used for supporting the LED epitaxial layer and avoids the LED epi-layers from breaking. In addition, the injected current does not need to flow through the transparent substrate 10. In other words, either poly-crystal or amorphous crystal can be used as the TS 10. Accordingly, the cost of manufacture can be down.

Thereafter, the epi-layer structure as shown in FIG. 1 is bonded together with the TS 10 by BCB layer 12. Thereafter, the opaque n-type GaAs substrate 24 is then removed and stopped at the etching stop layer 22 by an etchant mixture, for example, $5H_3PO_4:3H_2O_2:3H_2O$ or $1NH_4OH:35H_2O_2$. If the material of the etching stop layer 22 is chosen from InGaP or AlGaAs, the layer 22 is preferably to be removed completely since those materials can still absorb the light generated from the active layer 18.

Figure 3:
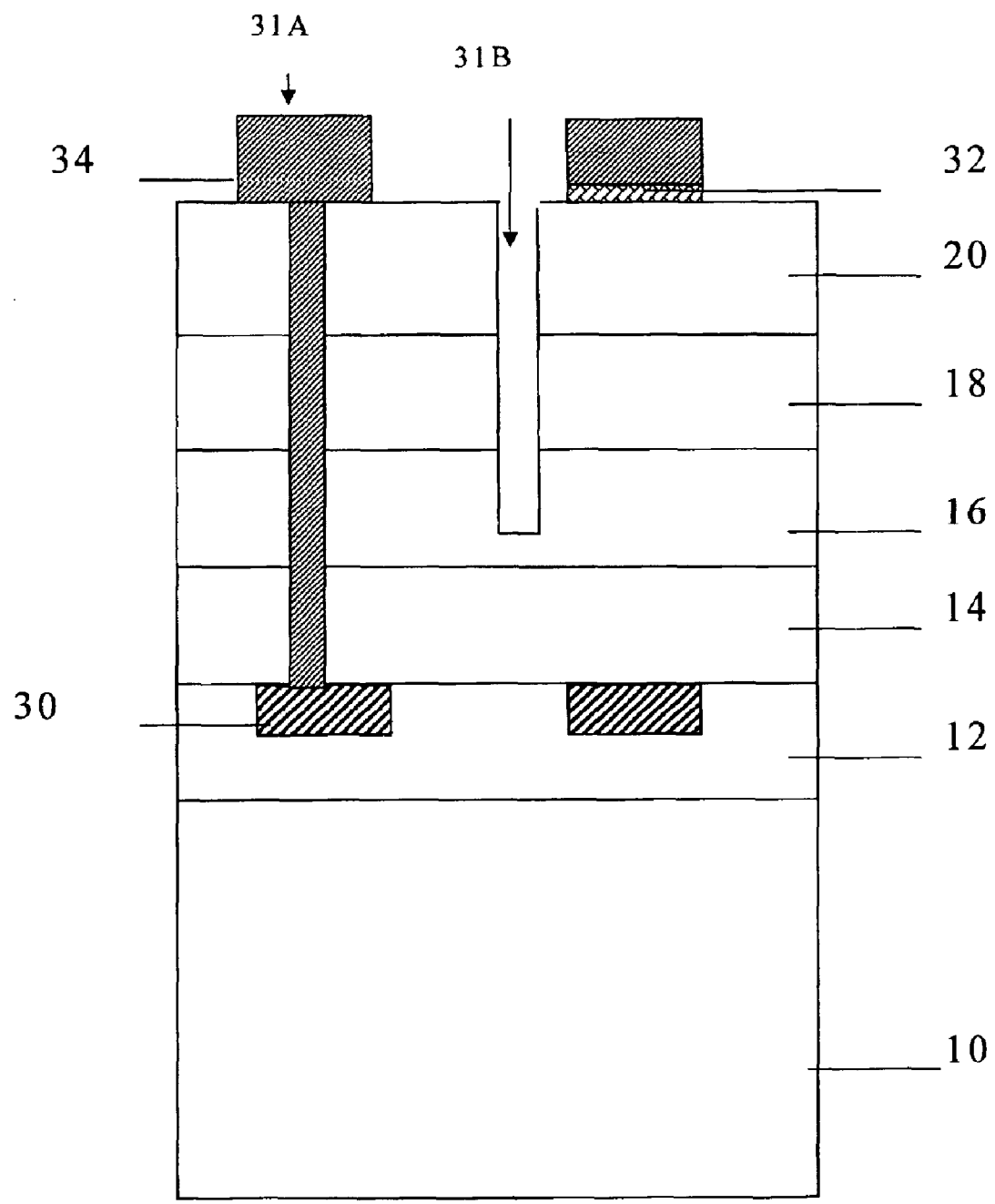
FIG. 3 is a schematic cross-sectional view of a series of fabricating process for a light emitting diode according to the preferred embodiment of the present invention.
Figure 4:
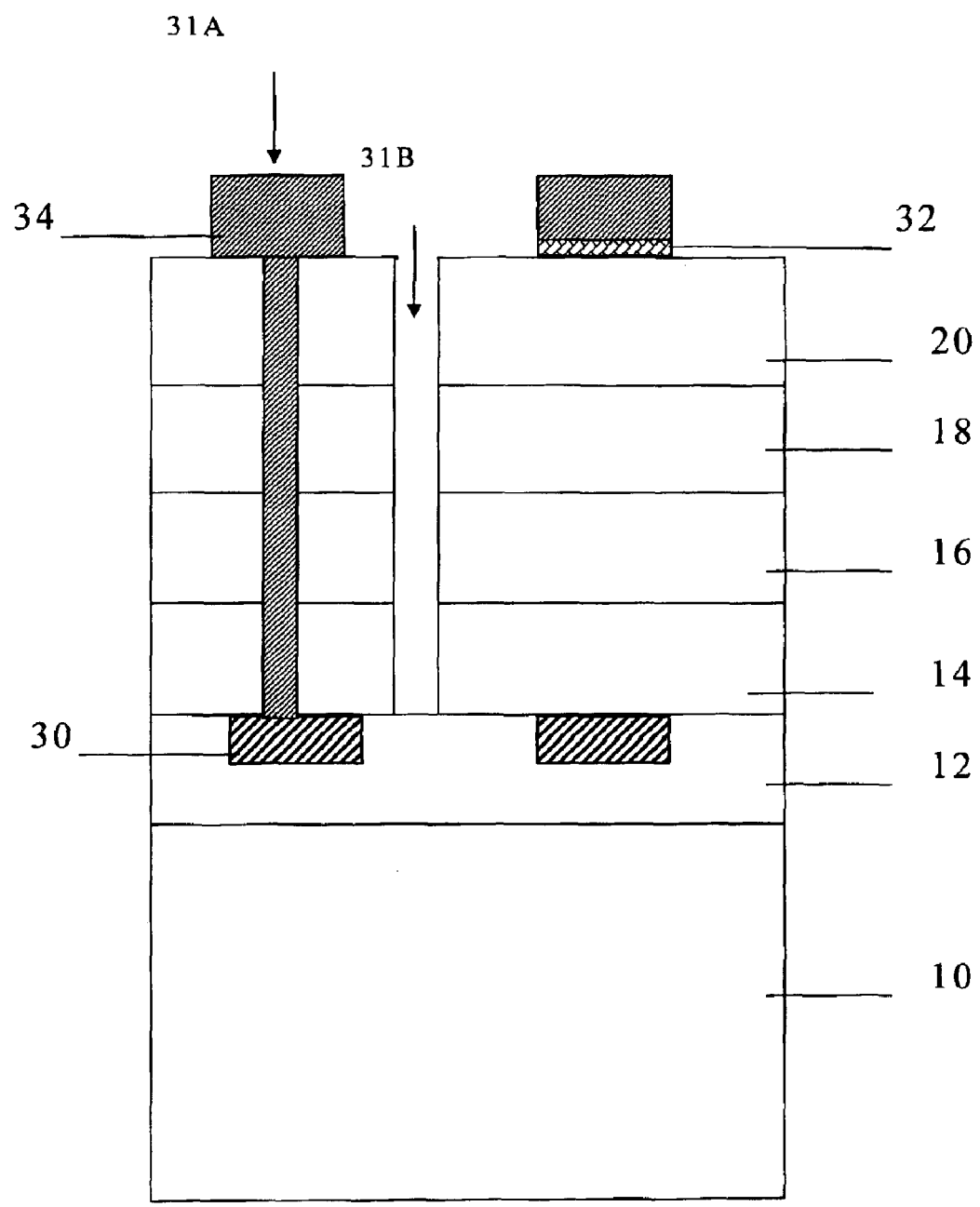
FIG. 4 is a schematic cross-sectional view of a series of fabricating process for a light emitting diode according to the preferred embodiment of the present invention.

To make LED with the n electrode and the p electrode on one side but with the same altitude, two etching steps are successively carried out. Referring to FIG. 3, the first step is to form a first connection channel 31A. The layers including the n-type lower cladding layer 20, the active layer 18, p-type upper cladding layer 16, and the p-type ohmic contact epi-layer 14 are etched sequentially, through a first lithography and an etching step. The etch step is processed until the p-type ohmic contact metal electrode 30 is exposed. The first connection channel 31A is about 1 to 3 mil. Afterward, a second etching step as before is performed to form a trench 31B, which at least isolates the active layer 18. In a first preferred embodiment, the etch step come down to the p-type upper cladding layer 16 or even lower more, till the p-type ohmic contact epi-layer 14 is etched too, as is shown in FIG. 4. The trench is about 0.2 to 1 mil in width.

Thereafter, a photoresist pattern (not shown) is coated on all areas. The photoresist pattern (not shown) having an opening exposed a portion of n-type lower cladding layer 20 to define n-type ohmic contact electrode 32. An ohmic contact metal layer is then deposited on all areas including the portion on the n-type lower cladding layer 20 and on the photoresist pattern. Afterward, a liftoff process is performed to remove the metal layer on the photoresist pattern. And then stripping away the photoresist pattern is done.

Still referring to FIG. 3, a photoresist layer (not shown) is coated on all areas. The photoresist layer is then pattern to form two openings: one exposes the first connection channel 31A and the surround region thereof, the other exposes the n-type ohmic contact electrode 32. The bonding metal layer 34 is then refilled the openings and deposited on the photoresist layer. Another liftoff process and photoresist stripping are then successively followed. The results are shown in FIG. 3 and FIG. 4.

Finally, an anneal process is conducted to make the n-type ohmic contact electrode 32 with the n-type lower cladding layer 20 and the p-type ohmic contact electrode 30 with p-type ohmic contact epi-layer 14 form good ohmic contacts.

Forgoing steps are just for illustrating the exemplary embodiment not intended to limit the claim scopes. It will be appreciated that various changes can be modified therein without departing from the spirit and scope of the invention. For example, the step order of forming the trench 31B can be done after the steps of forming the n-type ohmic contact electrode 32 and the boding metal 34.

The power output of the AlGaInP four components LED, operated at 20 mA in accordance with the present invention is of about 4 mW which is about two times as light intensity as conventional LED including absorption substrate.

The method of the present invention does not restrict itself to the high intensity AlGaInP four components LED. In fact the method of forming LED with two electrodes at one side and same altitude level can be appropriated to other type LED, for instance, GaN LED of blue light, GaAsAl LED of red light or other infrared ray LED.

Figure 5:
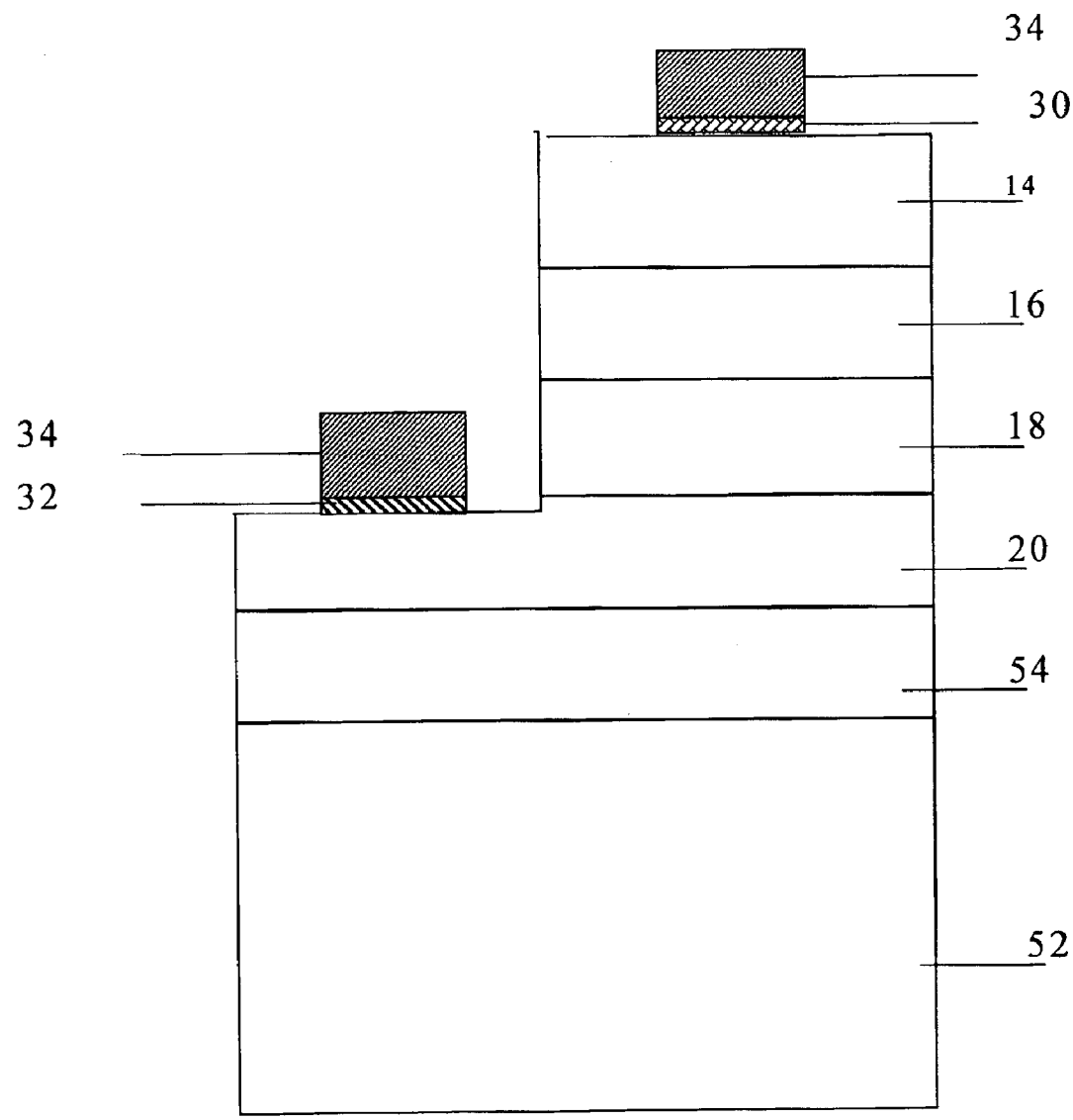
FIG. 5 is a schematic cross-sectional view of a conventional light emitting diode with a p electrode and an n electrode on the same side but different in height.
Figure 6:
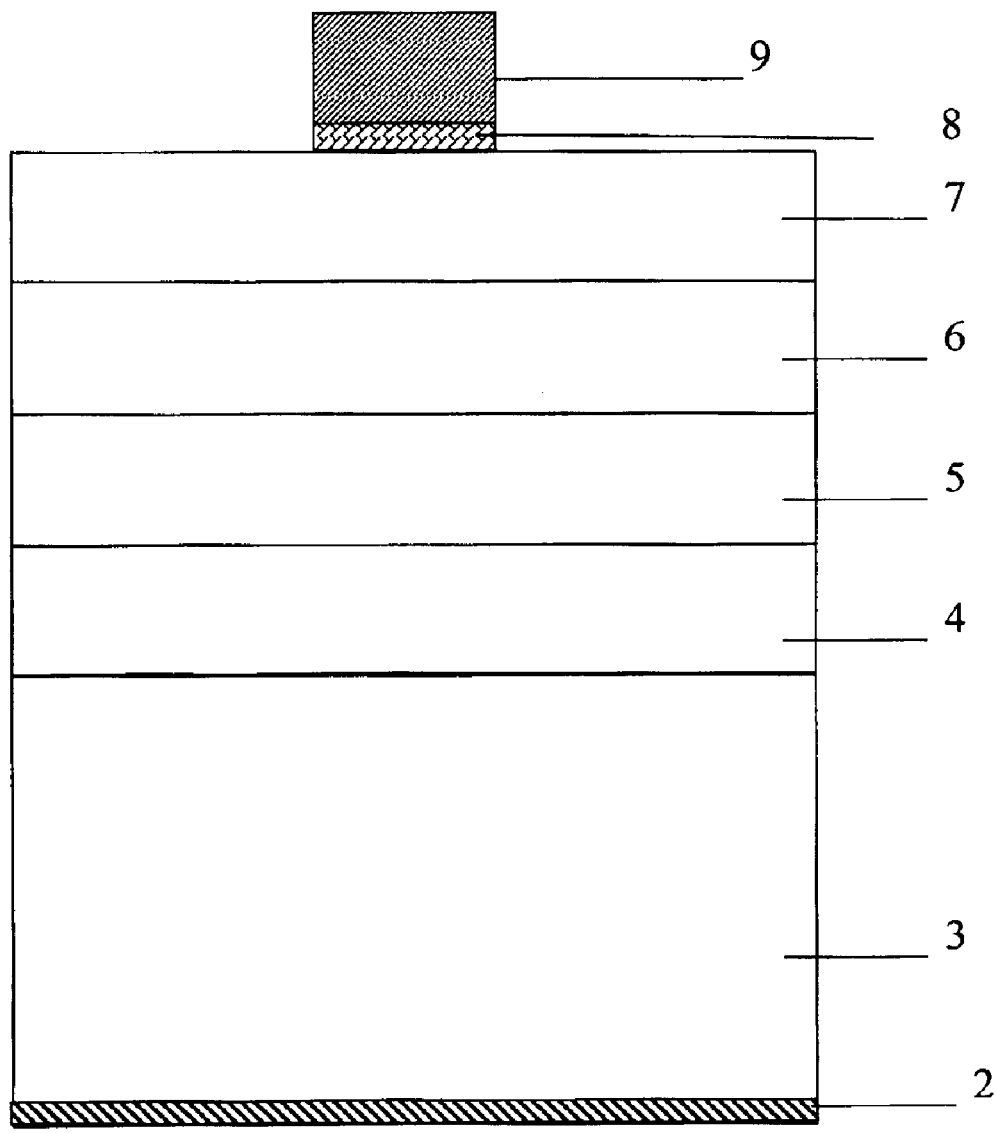
FIG. 6 is a schematic cross-sectional view of a conventional light emitting diode with a p electrode and an n electrode on the different side.

The invention method is intended to form two bonding metal layers 34 at the same side and same level height. Flip-chip package is preferred for the present structure. No bonding wires are required. The reliability of the device is thus better than the conventional package with boding wires. An example of conventional one is shown in the FIG. 5. For simplicity, the same numerals as the invention structure represent the same layers. The label 52 denotes a substrate, and label 54 may be a buffer layer. In FIG. 5, the LED structure has two electrodes at the same side but different level height. It is thus demanded a conductive paste layer to fill the land level. However, conductive paste overflow problem may suffer while anneal. The overflow may lead to circuit short. No such issue will occur on the present invention structure due to two electrode are at the same height.

The transparent substrate 10 provides performances of less or almost free light absorption. It is thus can significantly increase light intensity. Moreover, if the transparent substrate 10 is selected from sapphire, glass or silicon carbide, the thickness of the transparent substrate 10 can further reduce to around 100 μm without suffering breaking problem due to they are solid enough. It is thus can manufacture LED dies with thin and small volume size.

The bonding layer 14, BCB (B-staged bisbenzocyclobutene) used is a soft bonding material, and thus it is good for bonding those chip with rough surface.

In addition, two electrodes of the LED structure have the same level height due to an isolating trench or an island separating the active layer 18 into two parts. The package difficult owing to rough etch surface of conventional LED, which has two parts in different altitude shown in FIG. 5, is no longer occurred.

While the preferred embodiment of the invention has been illustrated and described, it will be appreciated that various changes can be made therein without departing from the spirit and scope of the invention.

What is claimed is:

1. A structure of light emitting diode, comprising:
   a transparent substrate;
   multi epi-layers, stacked sequentially from a bottom thereof, being with an upper cladding layer, an active layer epi-layer, a lower cladding layer;
   an ohmic contact epi-layer formed on said upper cladding layer;
   a first ohmic contact electrode metal layer formed on said ohmic contact epi-layer;
   a transparent bonding layer;
   the transparent substrate bonded on said first ohmic contact electrode metal layer by the transparent bonding layer;
   said multi epi-layers having a connection channel and a trench formed therein, wherein said connection channel is an electrical connection channel from said lower cladding layer punch-through said ohmic contact epi-layer so as to contact the first ohmic contact electrode metal layer and said trench is an isolated trench isolating at least said active layer into two parts; one part having said connection channel though it, the other part free connection channel;
   a second ohmic contact electrode metal layer formed on said lower cladding layer of said part of free said connection channel;
   a first bonding metal layer filled in connection channel; and
   a second bonding metal layer formed on said second ohmic contact electrode metal layer.

2. The structure of light emitting diode according to claim 1, wherein said active layer can be a single hetero-structure (SH), a double hetero-structure (DH), or multiple quantum wells (MQW).

3. The structure of light emitting diode according to claim 1, wherein said ohmic contact epi-layer is a p-type ohmic contact epi-layer.

4. The structure of light emitting diode according to claim 1, wherein said first ohmic contact electrode metal layer is a p-type ohmic contact layer and said second ohmic contact electrode metal layer is a n-type ohmic contact layer.

5. The structure of light emitting diode according to claim 1, wherein said transparent substrate is a single crystal or polycrystalline.

6. The structure of light emitting diode according to claim 1, wherein said transparent substrate is selected from the group consisting of ZnSe, ZnS, ZnSSe, SiC, GaP, GaAsP, and sapphire.

7. The structure of light emitting diode according to claim 1, wherein said transparent bonding layer is a BCB (B-staged bisbenzocyclobutene) resin.

* * * * *